(12) United States Patent
Bhanja et al.

(10) Patent No.: US 10,198,402 B1
(45) Date of Patent: ***Feb. 5, 2019

(54) MAGNETIC COPROCESSOR AND METHOD OF USE

(71) Applicants: Sanjukta Bhanja, Tampa, FL (US); Sudeep Sarkar, Tampa, FL (US); Ravi Panchumarthy, Tampa, FL (US); Dinuka K. Karunaratne, Tampa, FL (US)

(72) Inventors: Sanjukta Bhanja, Tampa, FL (US); Sudeep Sarkar, Tampa, FL (US); Ravi Panchumarthy, Tampa, FL (US); Dinuka K. Karunaratne, Tampa, FL (US)

(73) Assignee: University of South Florida, Tampa, FL (US)

( * ) Notice: Subject to any disclaimer, the term of this patent is extended or adjusted under 35 U.S.C. 154(b) by 9 days.

This patent is subject to a terminal disclaimer.

(21) Appl. No.: 15/664,760

(22) Filed: Jul. 31, 2017

Related U.S. Application Data

(63) Continuation-in-part of application No. 15/192,524, filed on Jun. 24, 2016, now Pat. No. 9,720,599.

(Continued)

(51) Int. Cl.
 *G06F 17/18* (2006.01)
 *H01F 7/06* (2006.01)
 *G11C 11/16* (2006.01)

(52) U.S. Cl.
 CPC .......... *G06F 17/18* (2013.01); *G11C 11/1673* (2013.01); *G11C 11/1675* (2013.01); *H01F 7/064* (2013.01)

(58) Field of Classification Search
 CPC ....... G06F 3/061; G06F 3/0655; G06F 3/0673
 See application file for complete search history.

(56) References Cited

U.S. PATENT DOCUMENTS

| 8,331,135 B2 | 12/2012 | Chen et al. |
| 8,698,517 B2 | 4/2014 | Behin-Aein |

(Continued)

FOREIGN PATENT DOCUMENTS

| WO | 0131789 A2 | 5/2001 |
| WO | 2014204492 A1 | 12/2014 |

OTHER PUBLICATIONS

International Preliminary Report on Patentability for PCT/US16/39338 (filing date: Jun. 24, 2016) with a priority date of Aug. 28, 2015; Applicant University of South Florida.

(Continued)

*Primary Examiner* — Tan V Mai
(74) *Attorney, Agent, or Firm* — Molly L. Sauter; Smith & Hopen, P.A.

(57) ABSTRACT

A magnetic system for solving one or more quadratic optimization problems by associating each of a plurality of variables of a quadratic optimization problem with a nanomagnet subset of a nanomagnet array, driving the nanomagnets of the nanomagnet subset to an excited state, allowing the nanomagnets of the nanomagnet subset to enter a relaxed state after being driven to an excited state, wherein the nanomagnets magnetically couple with one another in the relaxed state to minimize the total magnetic coupling energy of the nanomagnet array, and sensing a magnetic coupling of the nanomagnets of the nanomagnet subset to solve the quadratic optimization problem.

20 Claims, 8 Drawing Sheets

Related U.S. Application Data

(60) Provisional application No. 62/211,384, filed on Aug. 28, 2015.

(56) References Cited

U.S. PATENT DOCUMENTS

| | | |
|---|---|---|
| 8,872,547 B2 | 10/2014 | Becherer et al. |
| 2009/0261434 A1 | 10/2009 | Kang et al. |
| 2014/0240277 A1 | 8/2014 | Yoo et al. |

OTHER PUBLICATIONS

Donahue et al., The Object Oriented MicroMagnetic Framework (OOMMF) project at ITL/NIST; Aug. 28, 2006, [retrieved on Aug. 28, 2016], Retrieved from Internet: ,URL: http://math.nist.gov/oommf/>.

Sarkar et al., Direct Quadratic Minimization using Magnetic Field-based Computing. IEEE International Workshop on Design and Test of Nano Devices, Circuits and Systems. 2008: 31-34.

International Search Report for PCT/US16/39338 (filing date: Jun. 24, 2016) dated Sep. 19, 2016; Applicant: University of South Florida.

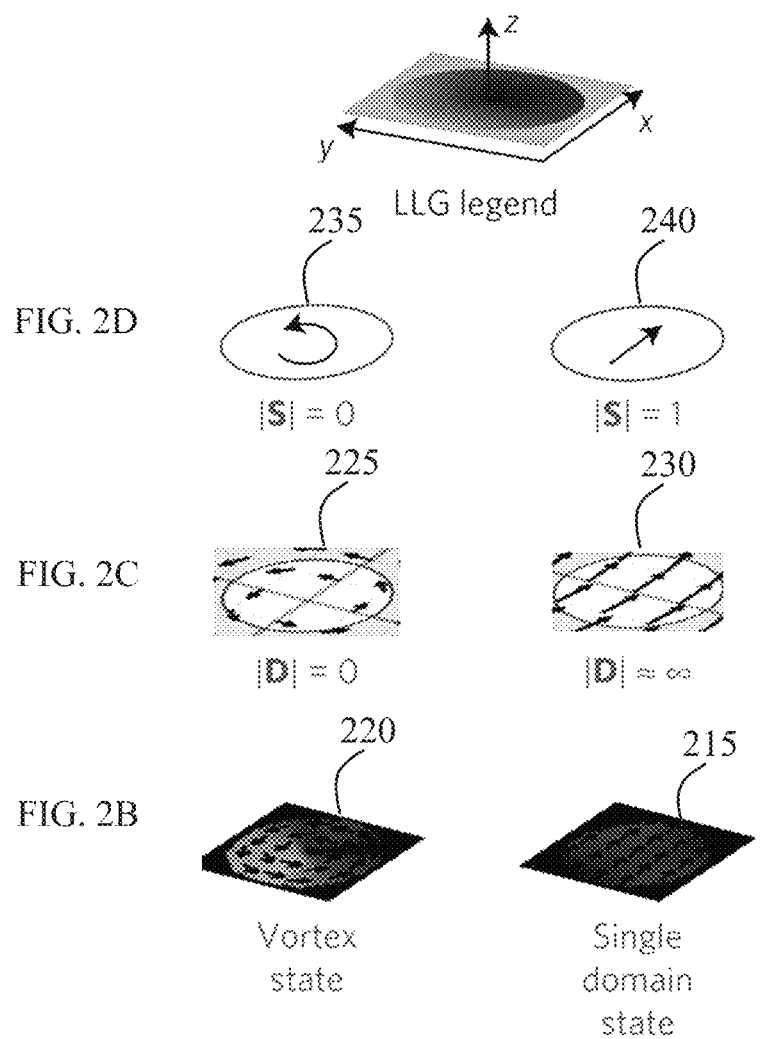

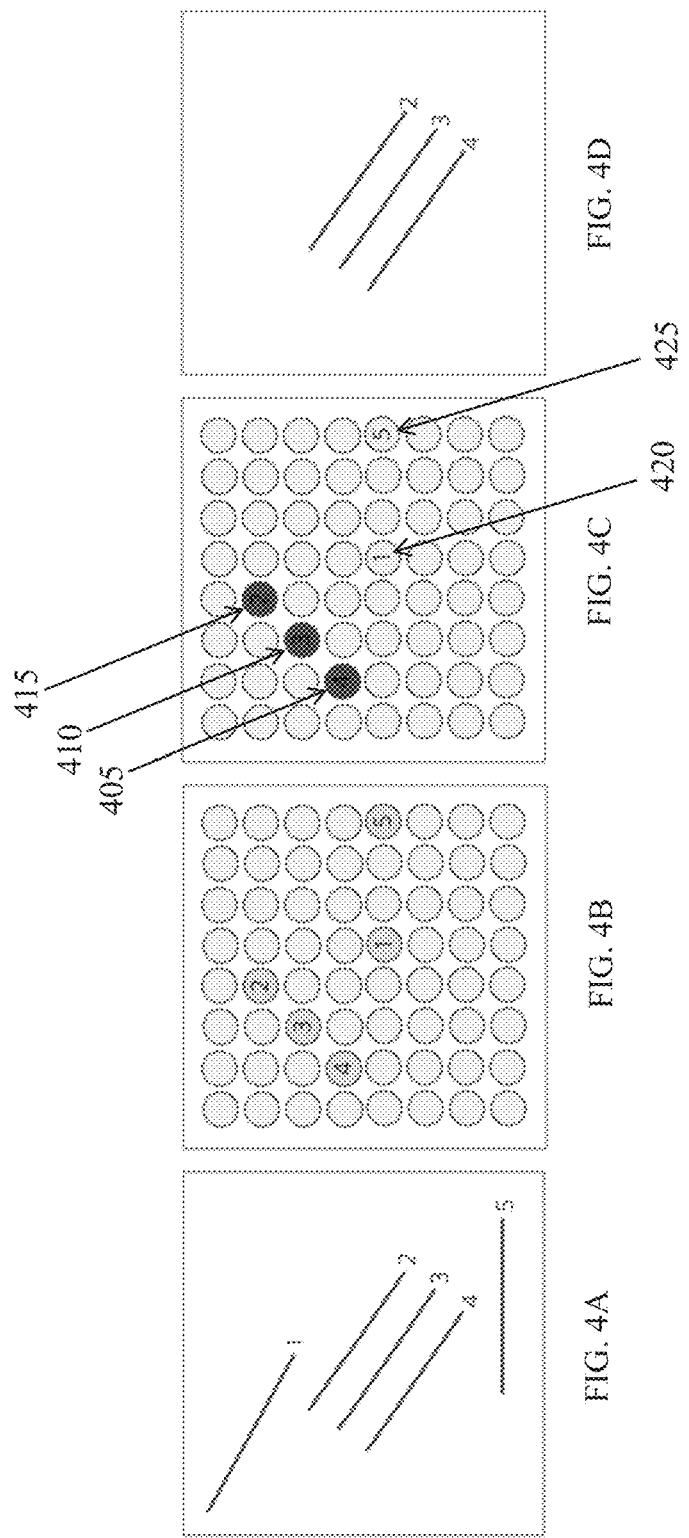

MAGNETIC COPROCESSOR AND METHOD OF USE

CROSS-REFERENCE TO RELATED APPLICATIONS

This application is a continuation-in-part of currently pending U.S. patent application Ser. No. 15/192,524 entitled "Magnetic Coprocessor and Method of Use", filed on Jun. 24, 2016, to be issued as U.S. Pat. No. 9,720,599, on Aug. 1, 2017, which claims priority to U.S. Provisional Patent Application No. 62/211,384 entitled, "Programmable Magnetic Energy Minimizing Co-Processor and Method of Use", filed Aug. 28, 2015.

STATEMENT OF GOVERNMENT INTEREST

This invention was made with government support under Grant Numbers 0639624 & 0829838 awarded by the National Science Foundation. The government has certain rights in the invention.

BACKGROUND OF THE INVENTION

In recent years, magnetic nanostructures have been widely used and researched for memory applications, but only non-volatility through remanence has been harnessed. The magnetic interaction between neighboring magnets has also been exploited for traditional Boolean computing. There has been other significant research in the field of non-Boolean computing using nanomagnets. For example, all-spin logic in device for processing and storing information and non-Boolean computing logic using spin-torque oscillators has been proposed.

The field of nanomagnetism has recently attracted tremendous attention as it can potentially deliver low-power, high-speed and dense non-volatile memories. It is now possible to engineer the size, shape, spacing, orientation and composition of sub-100 nm magnetic structures. This has spurred the exploration of nanomagnets for unconventional computing paradigms.

Many computer vision applications, including motion segmentation, correspondence, figure-ground segmentation, clustering, grouping, subgraph matching and digital graph matching require solving quadratic optimization problems. Solutions to the automated recognition of objects from an image typically involve three steps: (1) feature extraction, (2) perceptual organization and (3) object matching. Although there are many hardware solutions to speed up the first step, the perceptual organization and object matching steps are still solved by software and conventional computation involving simulated annealing or graph-cut based solutions. These vision problems place high demand on conventional computational resources, such as Boolean logic based computing platforms, and numerous clock cycles to arrive at a solution.

Accordingly, what is needed in the art is a system and method for solving complex quadratic optimization problems in fewer clock cycles than that required for traditional conventional computational resources.

SUMMARY OF INVENTION

The present invention provides a system and method that harnesses the innate physical properties of nanomagnets to directly solve computationally hard problems with a system of interacting nanomagnets in a one-shot fashion. This approach can be applied to a wide range of non-convex quadratic optimization problems that arise in many scientific domains.

The central theme of this physics-inspired computing methodology is mapping quadratic energy minimization problem spaces into a set of interacting magnets such that the energy relationship between the problem variables is proportional to that of the energies between the corresponding magnets. The optimization is actually accomplished by the relaxation physics of the magnets themselves and the solutions can be read-out in parallel. In essence, given a specific instance of the problem, a specific magnetic layout can be determined, the relaxed state of which will be the solution to the original problem.

In one embodiment, the present invention provides a method for solving a quadratic optimization problem. The method includes, associating each of a plurality of variables of a quadratic optimization problem with a nanomagnet of a nanomagnet array, driving the nanomagnets of the nanomagnet array to an excited state, allowing the nanomagnets of the nanomagnet array to enter a relaxed state after being driven to an excited state, wherein the nanomagnets magnetically couple with one another in the relaxed state to minimize the total magnetic coupling energy of the nanomagnet array, and sensing a magnetic coupling of the nanomagnets of the nanomagnet array to solve the quadratic optimization problem.

Associating each of a plurality of variables of a quadratic optimization problem with a nanomagnet of a nanomagnet array further includes, identifying a plurality of variables of a quadratic optimization problem, mapping a nanomagnet of the nanomagnet array to each of the variables of the quadratic optimization problem, wherein the distances between the nanomagnets that have been mapped to the variables of the quadratic optimization problem are such that a magnetic coupling energy of the nanomagnets is proportional to an energy relationship between the plurality of variables in the quadratic optimization problem.

Prior to driving the nanomagnets to an energized state, the method further includes, selecting the nanomagnets of the nanomagnet array that have been mapped to the variables of the quadratic optimization problem and deselecting the nanomagnets of the nanomagnet array that have not been mapped to the variables of the quadratic optimization problem.

Sensing a magnetic coupling of the nanomagnets of the nanomagnet array to solve the quadratic optimization problem further includes, sensing a state of each of the plurality of nanomagnets of the nanomagnet array to identify one or more nanomagnets of the plurality of nanomagnets that are in a single domain state and mapping the single domain state nanomagnets back to the plurality of variables of the quadratic optimization problem to solve the quadratic optimization problem.

In various embodiments, the quadratic optimization problem may be selected from a group of quadratic optimization problems consisting of motion segmentation, correspondence, figure-ground segmentation, clustering, grouping, subgraph matching and digital graph matching.

In a particular embodiment, the quadratic optimization problem is a quadratic optimization problem for identifying salient edge segments of an image, and wherein associating each of a plurality of variables of a quadratic optimization problem for identifying salient edge segments of an image with a nanomagnet of a nanomagnet array further includes, processing an image to identify a plurality of edge segments of the image, calculating an affinity matrix for the plurality of edge segments of the image, calculating a distance map matrix for the plurality of edge segments of the image, generating the nanomagnet array based upon the affinity matrix and the distance map matrix and mapping each of the edge segments of the image to one of the nanomagnets of the nanomagnet array.

In an additional embodiment, a single array of nanomagnets may be used to solve more than one quadratic optimization problem. In this embodiment, a nanomagnet array comprising a plurality of nanomagnets may be subdivided into nanomagnet subsets, each comprising a subset of nanomagnets of the nanomagnet array. A specific quadratic optimization problem may then be assigned to each of the nanomagnet subsets. In a particular embodiment, each of the assigned optimization problem may be solved in parallel. Alternatively, in another embodiment, selection circuitry may be used to select one or more of the quadratic optimization problems to be solved using the nanomagnet subsets associated with the selected quadratic optimization problem.

In an additional embodiment, the present invention provides a system for solving quadratic optimization problems. The system includes a nanomagnet array comprising a plurality of nanomagnets, read/write/drive circuitry coupled to the nanomagnet array and a compiler coupled to the drive circuitry and the read/write/drive circuitry. The compiler is configured for associating each of a plurality of variables of a quadratic optimization problem with a nanomagnet of the nanomagnet array, instructing the read/write/drive circuitry to drive the nanomagnets of the nanomagnet array to an excited state, allowing the nanomagnets of the nanomagnet array to enter a relaxed state after being driven to an excited state, wherein the nanomagnets magnetically couple with one another in the relaxed state to minimize the total magnetic coupling energy of the nanomagnet array and instructing the read/write/drive circuitry to sense a magnetic coupling of the nanomagnets of the nanomagnet array to solve the quadratic optimization problem.

In various embodiments, the nanomagnetic array may be reconfigurable by the magnetic coprocessor. In particular, the nanomagnet array may be a two-dimensional spin-transfer torque magnetic random access memory (STT-MRAM) reconfigurable array and the read/write/sense circuitry may include a plurality of complementary metal-oxide semiconductor transistors.

In another embodiment, the present invention may include one or more non-transitory computer-readable media having computer-executable instructions for performing a method of running a software program on a computing device for solving a quadratic optimization problem, the computing device operating under an operating system. The method of running the software program on the computing device may include issuing instructions from the software program for, communicatively accessing the operating system of the computing device, associating each of a plurality of variables of a quadratic optimization problem with a nanomagnet of a nanomagnet array, driving the nanomagnets of the nanomagnet array to an excited state, allowing the nanomagnets of the nanomagnet array to enter a relaxed state after being driven to an excited state, wherein the nanomagnets magnetically couple with one another in the relaxed state to minimize the total magnetic coupling energy of the nanomagnet array and sensing a magnetic coupling of the nanomagnets of the nanomagnet array to solve the quadratic optimization problem.

As such, the present invention provides a system and method for directly solving computationally difficult problems with a single input-output cycle as compared to order of magnitude more clock cycles that would be needed for a standard simulated annealing or graph-cut based solution.

BRIEF DESCRIPTION OF THE DRAWINGS

For a fuller understanding of the invention, reference should be made to the following detailed description, taken in connection with the accompanying drawings, in which:

FIG. 2B illustrates the first level of abstraction, demonstrating LLG simulations of the multiple magnetization states, single domain state and vortex state, of a nanomagnetic disk, in accordance with an embodiment of the present invention.

FIG. 2C illustrates the second level of abstraction by providing a virtual vortex model wherein the magnetization is represented by vector D, $|D|=0$ $|D|=\infty$, from the virtual vortex core to the disk center, in accordance with an embodiment of the present invention.

FIG. 2D illustrates the third level of abstraction, demonstrating a magnetization state model where the magnetization state is represented by variable S, and wherein a vortex state is represented by '0' and a single domain state is represented by a unit vector whose direction captures the direction of the single domain arrangement, in accordance with an embodiment of the present invention.

FIG. 4A illustrates the steps involved in determining the salient edges using the nanomagnetic coprocessor of the present invention, including edge detection, affinity matrix calculation, multidimensional scaling and mapping of edge segments to nanomagnets.

FIG. 4B illustrates the steps involved in determining the salient edges using the nanomagnetic coprocessor of the present invention, including activating computing nanomagnets and deactivating non-computing magnets.

FIG. 4C illustrates the steps involved in determining the salient edges using the nanomagnetic coprocessor of the present invention, including magnetic computing and relaxation.

FIG. 4D illustrates the steps involved in determining the salient edges using the nanomagnetic coprocessor of the present invention, including determination of the edge segments features by back-tracing the mapping of the single domain computing nanomagnets with edge segments.

DETAILED DESCRIPTION OF THE PREFERRED EMBODIMENT

Figure 1:
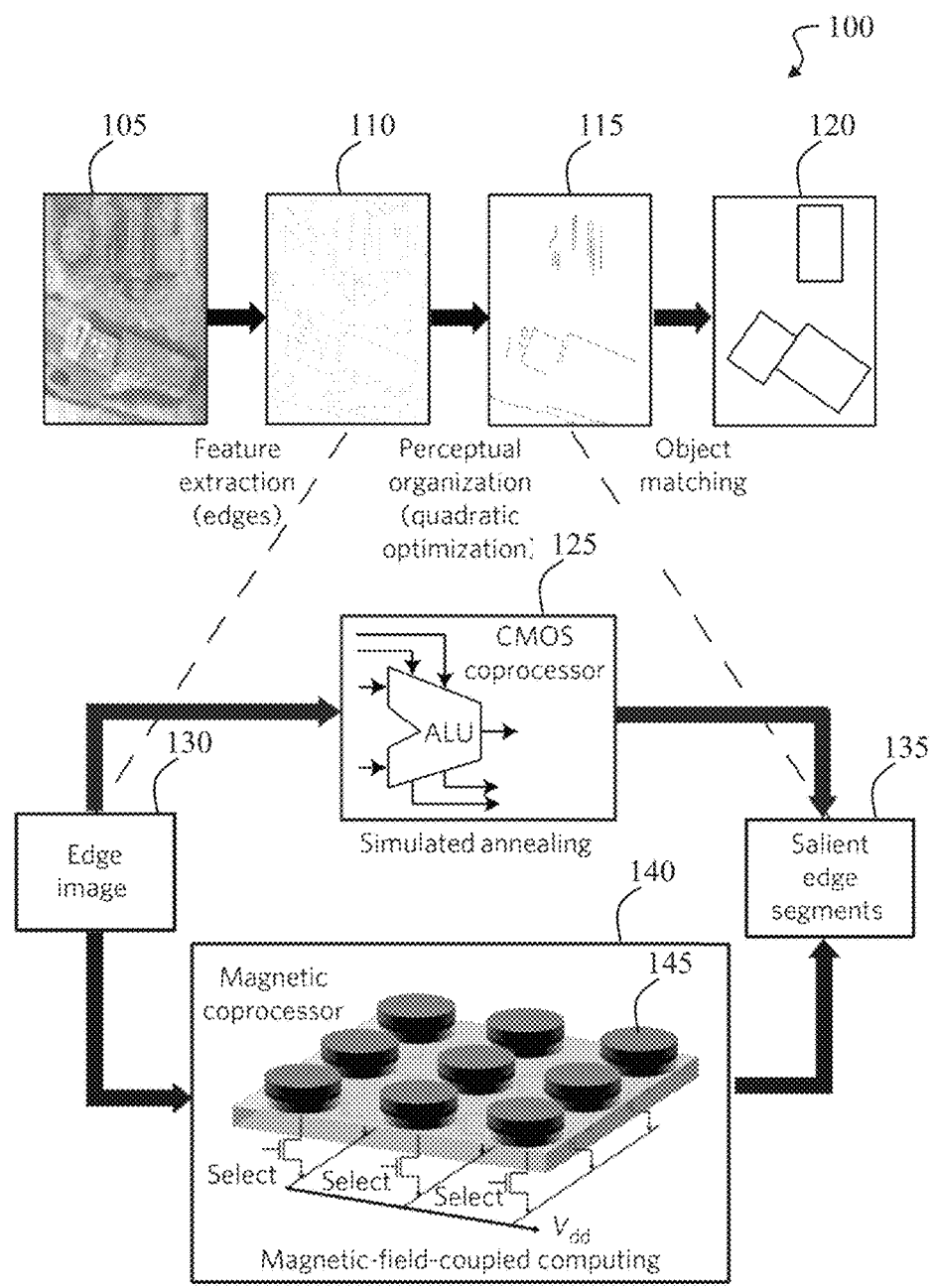
FIG. 1 is an illustration of the stages involved in object recognition, in accordance with an embodiment of the present invention.

The present invention provides a system and method for mapping quadratic energy minimization problem spaces into a set of interacting magnets, such that the energy relationship between the problem variables is proportional to that of the energies between the corresponding magnets. The optimization is accomplished by the relaxation physics of the magnets themselves and solutions can be read-out in parallel. In essence, given a specific instance of a problem, a specific magnetic layout can be arrived at wherein the relaxed state of which will be the solution of the original problem. Additionally, the system can be used to solve multiple quadratic energy minimization problems simultaneously by assigning each problem to a unique area of the magnetic array.

Nanomagnetic logic architectures compute information by minimizing their total magnetization energy. In accordance with the present invention, this energy minimizing nature of magnetic systems is harnessed to solve several classes of quadratic optimization problems that arise in many computer vision applications, including motion segmentation, correspondence, figure-ground segmentation, clustering, grouping, subgraph matching and digital graph matching. The present invention provides for a reduction of computational complexity utilizing magnetic coprocessor solutions, when compared to traditional solutions, since nanomagnets solve the energy functions directly and the solution can be retrieved in a one-shot fashion. Preliminary calculations for one common problem experienced in computer vision suggest that the magnetic coprocessor of the present invention will yield an order of magnitude faster solution consistently, even with large problem sizes.

In a particular embodiment, the present invention provides for the solution of quadratic optimization problems regarding perceptual organization in computer vision applications. Solutions to the automated recognition of objects from an image typically involve three steps: (1) feature extraction, (2) perceptual organization and (3) object matching. While there are many hardware solutions to speed up the feature extraction step, the perceptual organization and object matching steps are commonly solved by software and conventional computation. In the present invention, a non-Boolean computation targeting the perceptual organization and object matching stages, and in particular the problem of perceptual organization, built around nanomagnets is provided.

When a collection of nanomagnetic disks are driven to an excited state and allowed to relax, they tend to couple magnetically with one another to minimize the total magnetic energy of the system. In the present invention, this energy minimization is harnessed to solve a quadratic objective function that arises in perceptual organization. The advantage of this method is that it computes the solution in a direct manner, regardless of the problem size (image features), unlike in a Boolean logic-based computation, wherein the number of iterations increases with the problem size. As such, the present invention harnesses the innate physical properties of nanomagnets to directly solve computationally difficult problems with a system of interacting nanomagnets in a one-shot fashion. The methods of the present invention can be applied to a wide range of non-convex quadratic optimization problems that arise in many scientific domains, including, but not limited to, Computational Biology, Social Media and Analytics.

While the present application can be used to solve many quadratic optimization problems, in order to illustrate the concepts of the invention, an exemplary embodiment for solving perceptual grouping problems that arise in computer vision systems is provided. Grouping problems in computer vision systems are a mid-level, computationally expensive, optimization problem that lies at the core of object recognition.

Perceptual organization is a critical step in object recognition. An example is illustrated with reference to FIG. 1, which shows the three stages involved in object recognition 100 for a grey-scale satellite image of an urban area 105. The first stage involves the detection of the boundaries between the contrast differences from the image 110 to provide an edge image 130. The second stage involves identifying the salient edge segments 135 by performing perceptual organization utilizing quadratic optimization 115. The third stage involves identifying objects using the identified salient edge segments 120. The traditional approach to solving the quadratic optimization process utilizing a CMOS-based arithmetic and logic unit 125 requiring numerous iterations and associated clock cycles. The method in accordance with the present invention utilizes a magnetic coprocessor 140 to solve the quadratic optimization process.

In a particular embodiment, the present invention provides a magnetic coprocessor 140 comprising a two-dimensional array of nanomagnetic disks that are integrated with read/write/clock circuitry. The magnetic coprocessor 140 may further include a compiler for processing an image, for identifying all the edge segments of the image and for mapping each edge segment to a unique nanomagnetic disk 145 in the coprocessor 140. The unselected nanomagnetic disks in the array are driven into a non-computing state. This mechanism isolates a cluster of nanomagnetic disks that represent edge segments in an edge image. Finally, the 'selected' nanomagnetic disks in the array are clocked into a computing state and allowed to relax to an energy minimum. The salient edge segments, representing the solution of the entire perceptual organization problem, are obtained by reading the magnetization states of all the nanomagnetic disks in a parallel readout fashion. Identifying the salient edge segments that belong to objects (salient group) involves associating each pair of edge segments with a pairwise affinity value capturing its saliency.

In the present invention, the fact that there is structure and organization in the world is exploited, wherein objects in the world tend to exhibit high levels of symmetry, parallelism, convexity, and coherence. These properties are known to be important in human perception according to Gestalt psychology; features with these properties will have high affinity with each other. In the present invention, the following pairwise affinity, $a_{ij}$ of the $i^{th}$ and $j^{th}$ edge segment in an edge image is used. This affinity function captures the saliency between edge segments that are parallel, perpendicular, connected and overlapped, as expressed in:

$$a_{ij} = \sqrt{l_i l_j} \exp - \frac{o_{ij}}{\max(l_i l_j)} \exp - \frac{d_{min}}{\max(l_i l_j)} \cos^2(2\psi_{ij}) \quad (1)$$

where $l_i$ and $l_j$ are the lengths of the $i^{th}$ and $j^{th}$ edge segments respectively; $\psi_{ij}$, $o_{ij}$ and $d_{min}$ are the angle, overlap and the minimum distance between the $i^{th}$ and $j^{th}$ edge segments, respectively.

Once all the pairwise affinity values are calculated, the next task in the second stage is to find the minimum number of edge segments that maximizes the total affinity value. These edge segments are grouped as salient through a quadratic optimization process and the objective function is expressed as:

$$\Sigma_{i=1}^N \Sigma_{j=i+1}^N a_{ij} x_i x_j + \lambda \Sigma_{i=1}^N x_i + \kappa \quad (2)$$

where $a_{ij}$ is the pairwise affinity value between the $i^{th}$ and $j^{th}$ edge segment. $x_i$ takes a value between 1 and 0, where "1" represents the highest saliency of an edge segment. N is the total number of edge segments. $\lambda$ takes the value of $-1$. $\kappa$ is the number of edge segments in the salient group. FIG. 1 shows the group of salient edge segments 115 identified from the feature extraction 110, computed using the objective function.

The final stage of objection recognition involves the matching between a model database and the salient groups. FIG. 1 shows the identified objects 120 from the grey-scale satellite image of an urban area 105. The critical task in these three stages is quadratic optimization, which is an unconstrained optimization problem. Prior art systems utilize Boolean logic and arithmetic-based operations to perform the quadratic optimization, which are computationally intensive for logic-based computing platforms. In contrast, in accordance with the present invention, a magnetic system has been formulated and demonstrated to solve such complex perceptual organization problems with a single input-output cycle as compared to an order of magnitude more clock cycles that would be needed for a Boolean logic-based computation.

It has been observed that strongly coupled nanomagnetic disks tends to have a single domain state and that weakly coupled nanomagnetic disks tend to have a vortex state. In the single domain state, the magnetic spins in the nanomagnetic disk are aligned in-plane direction. Whereas, in the vortex state, the magnetic spins have a curing configuration around the disk center. When the magnets are closer to each other, the coupling energy between the nanomagnetic disks will keep the nanomagnetic disks in the single domain state, and if they are far apart, the exchange energy, anisotropy energy and demagnetization are dominant and the nanomagnetic disk will go to its vortex state. This mechanism allows for a qualitative value for the magnetic coupling strengths among the nanomagnetic disks to be obtained. In this present invention, this phenomenon is exploited to identify strongly coupled nanomagnetic disks, which correspond to salient edge segments.

Figure 2A:
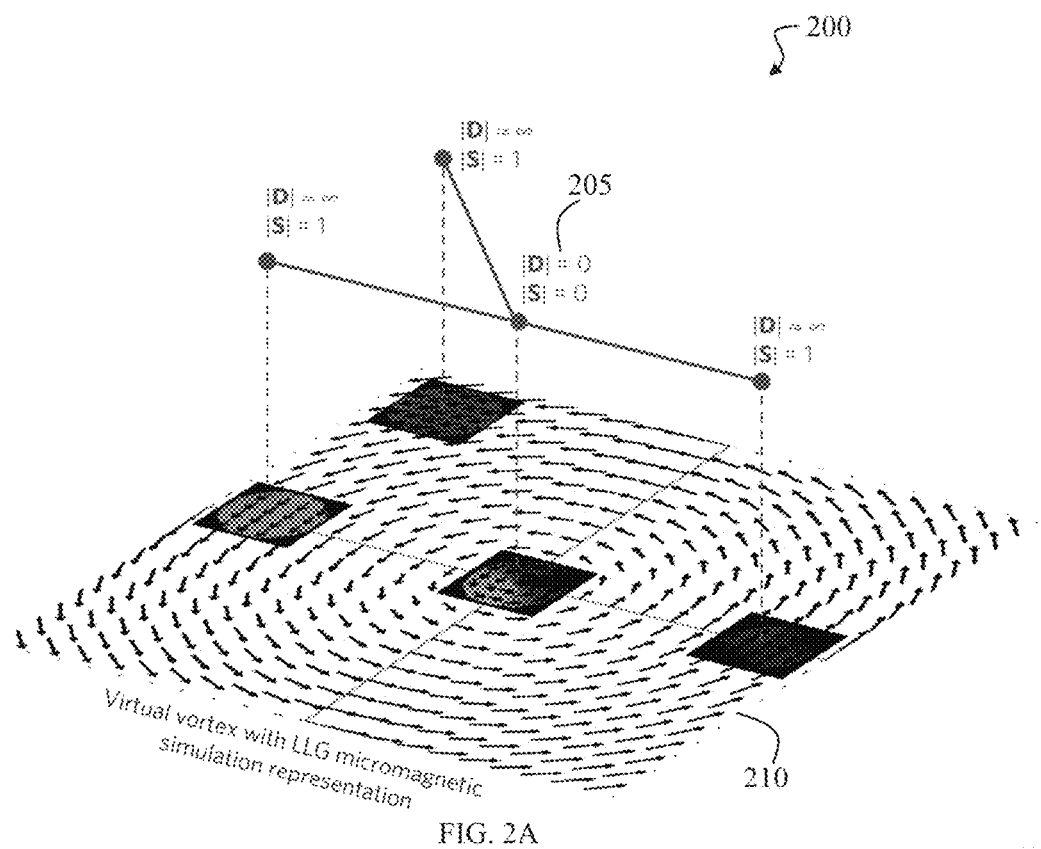
FIG. 2A is a schematic of the magnetization spin configuration representation of the virtual vortex model, in accordance with an embodiment of the present invention.

To associate the magnetization state space with the saliency of an edge segment, the magnetization state is mapped to a variable S, the magnitude of which is either 0 or 1, through a magnetization state abstraction model. Here, a vortex state is represented by '0' and a single domain state by '1'. The magnitude of the magnetization state $|S|$ is approximated numerically by a step function based on the internal energies of the nanomagnetic disks obtained from simulation experiments, governed by the Landau-Lifshitz-Gilbert (LLG) equation. A schematic of the levels of abstraction is illustrated in FIG. 2A-FIG. 2D. FIG. 2A illustrates the LLG magnetization spin configuration representation of the virtual vortex model, wherein the virtual vortex core 205 lies at the center of the plane 210. FIG. 2B illustrates the first level of abstraction, demonstrating LLG simulations of the multiple magnetization states, single domain state 210 and vortex state 220, of a nanomagnetic disk. FIG. 2C illustrates the second level of abstraction by providing a virtual vortex model wherein the magnetization is represented by vector D, $|D|=0$ 225 $|D|=\infty$ 230, from the virtual vortex core 205 to the disk center. FIG. 2D illustrates the third level of abstraction, demonstrating a magnetization state model where the magnetization state is represented by variable S, and wherein a vortex state is represented by '0' 235 and a single domain state 240 is represented by a unit vector whose direction captures the direction of the single domain arrangement.

The magnetization state variable magnitude $|S|$ is a step function based on the base ten logarithmic of the $|D|$ value and can be expressed as:

$$|S_i| = \begin{cases} 0, & \log_{10}|D_i| < \eta \\ 1, & \log_{10}|D_i| \geq \eta \end{cases} \quad (3)$$

where $|D_i|$ is the magnitude of the vector pointing from the virtual vortex to the disk center of the ith nanomagnetic disk and $\eta = -5.1$ A magnetic Hamiltonian in quadratic form is then developed that matches the objective function of the vision problem in equation (2). The magnetic Hamiltonian developed is expressed as follows:

$$\gamma \Sigma_{i=1}^N \Sigma_{j=i+1}^N e^{-\sigma r_{ij}} S_i \cdot S_j + \beta \Sigma_{i=1}^N |S_i| + N\omega \quad (4)$$

where $r_{ij}$ is the center-to-center distance between the ith and jth nanomagnetic disks. $S_i$ and $S_j$ are the state values for the ith and jth nanomagnetic disks, respectively. $\gamma$, $\sigma$, $\beta$ and $\omega$ are parameters found using numerical approximation methods.

The correspondence between the magnetic Hamiltonian and the objective function of the vision problem is exploited to spatially arrange the nanomagnetic disks. The correspondence between the objective function in equation (2) and the magnetic Hamiltonian in equation (4) can be observed. The magnetization states ($S_i$, $S_j$) and center-to-center distance $r_{ij}$ in the magnetic Hamiltonian correspond to the saliency ($x_i$, $x_j$) and pairwise affinity ($a_{ij}$) in the objective function, respectively.

The center-to-center distance between the nanomagnetic disks is based on the pairwise affinity matrix and the distance map matrix. The center-to-center distances between all pairs of nanomagnetic disks are calculated such that $r_{ij}=1/\log(a_{ij})$. The computed $r_{ij}$ values are reconstructed into the form of an adjacency matrix. To spatially arrange the nanomagnetic disks, a statistical information visualization method known as multidimensional scaling (MDS) is used. MDS uses the adjacency matrix as an input and provides a set of two-dimensional coordinates to locate the disk centers of the nanomagnetic disks.

Figure 3:
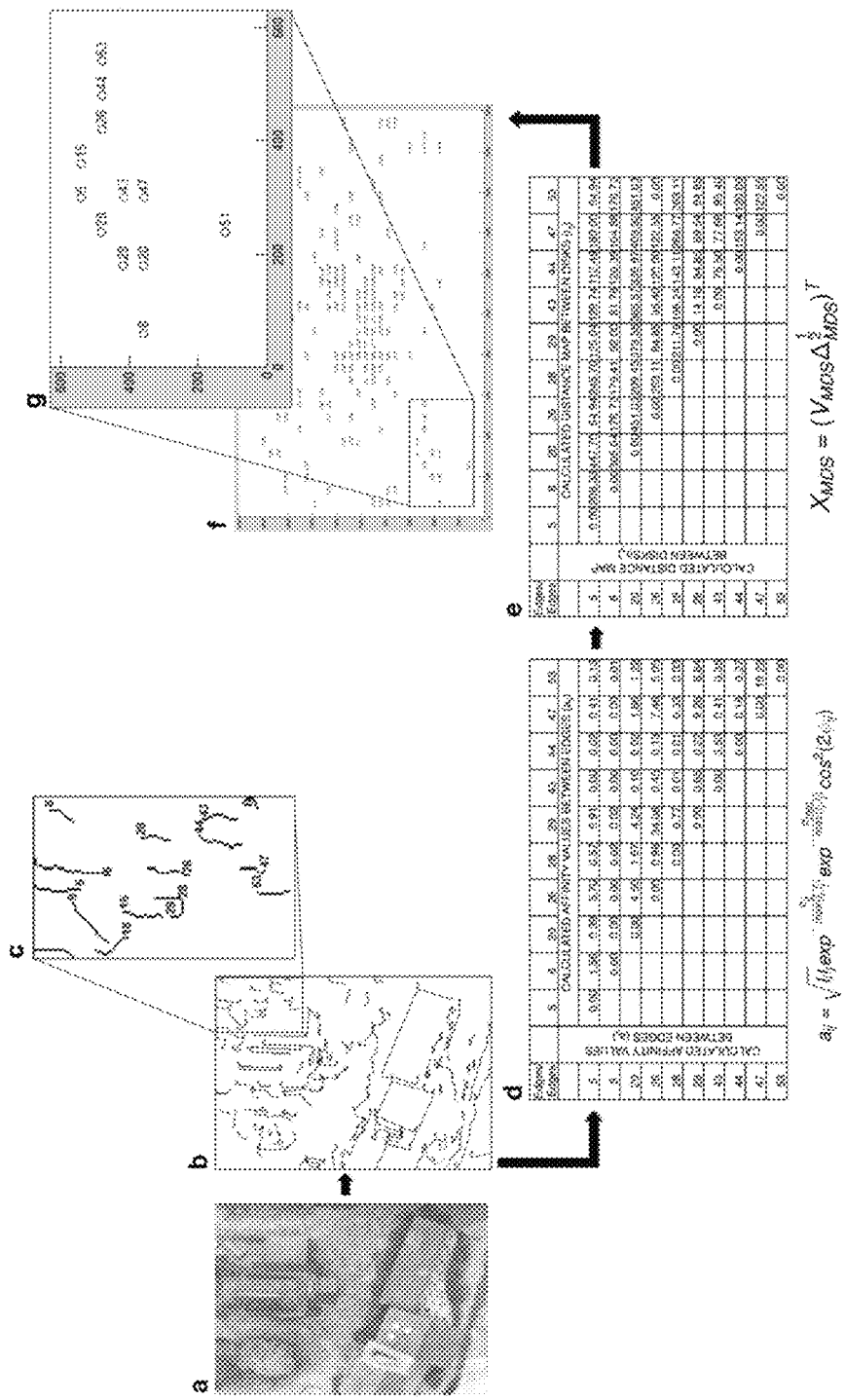
FIG. 3 illustrates a schematic of the steps involved in generating the 2D layout of the nanomagnetic disks, in accordance with an embodiment of the present invention.

As shown with reference to FIG. 3, the objective is to find the 2D placement coordinates of nanomagnets where each of them represents an edge segment and such that the coupling energy between two magnets, i and j, is proportional to the pairwise edge affinity $a_{ij}$. As shown in FIG. 3, in order to generate the 2D layout of the nanomagnetic disk, first a grey scale image is provided 300, an edge image with extracted edge segments is computed 305, (zoomed-in portion 310). A partial affinity matrix ($a_{ij}$) 315 is then calculated between the edge segments 310. The calculated partial distance map matrix ($r_{ij}$) 320 is then calculated and used for the placement of the nanomagnetic disks, based on a statistical method—multidimensional scaling (MDS). A 2D layout of the nanomagnetic disks 325, (zoomed-in portion 330) is then obtained from the distance map matrix ($r_{ij}$) 320 to provide a placement of the nanomagnetic disks 325, 300 that corresponds to the edge segments 305, 310. In this embodiment, the nanomagnet placement solution is given by the first two rows of the distance map matrix and each column of this matrix provides the coordinates of the corresponding nanomagnet to consider.

FIG. 4A-FIG. 4E illustrates the steps involved in determining the salient edges of an image using the nanomagnetic coprocessor of the present invention. As shown in FIG. 4A, in the first step, the compiler maps each edge segment to a single nanomagnet, by performing edge detection, affinity matrix calculation, multidimensional scaling and mapping of features (edge segments) to nanomagnets. In the second step, the computing nanomagnets are activated and non-computing nanomagnets are deactivated, wherein each computing nanomagnet represents an edge segment, as shown in FIG. 4B. The third step involves magnetic computing and relaxation, followed by identification of the computing magnet's magnetization state, wherein the computing nanomagnets relax to a single domain state 405, 410, 415 or a vortex state 420, 425, as shown in FIG. 4C. In the final step, shown in FIG. 4D, determination of the salient features (edge segments) is performed by back-tracing the mapping of the single domain computing nanomagnets 405, 410, 415 with the features (edge segments) of the image.

Figures 5A, 5B, 5C, 5D, 5E, 5F, 5G, 5H, 5I, 5J, 5K, 5L, 5M, 5N, 5O, 5P, 5Q, 5R, 5S, 5T:
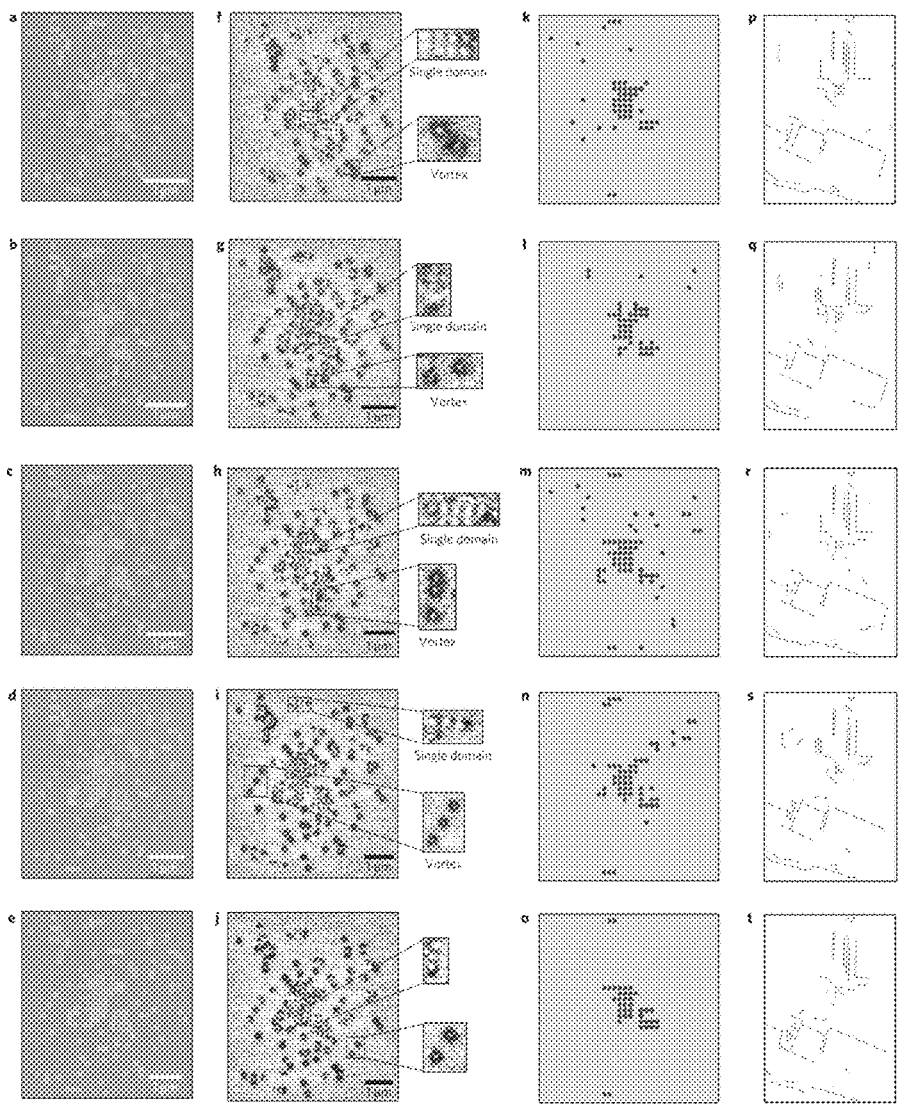
FIG. 5A-FIG. 5E are SEM images of five different nanomagnetic systems, in accordance with embodiments of the present invention.
FIG. 5F-FIG. 5J are MFM images of five different nanomagnetic systems, in accordance with embodiments of the present invention.
FIG. 5K-FIG. 5O are images of the magnetization state identification, in accordance with embodiments of the present invention.
FIG. 5P-FIG. 5T are images of the sedge segments identified by the fabricated magnetic system in accordance with embodiments of the present invention.

To validate experimentally the non-Boolean computing method of the present invention, magnetic systems were fabricated on silicon wafers using standard electron-beam lithography, electron-beam evaporation and a lift-off process. The exemplary magnetic systems were characterized with a combination of scanning electron microscope (SEM) and an atomic force microscope (AFM) to identify the defect-free magnetic systems, as illustrated in FIG. 5A-FIG. 5T, and to obtain the average diameter and average thickness of the nanomagnetic disks in each magnetic system, as shown in Table 1. FIG. 5A-FIG. 5E illustrate SEM images of five exemplary nanomagnetic systems. FIG. 5F-FIG. 5J illustrate MFM images of the five exemplary nanomagnetic systems. FIG. 5K-FIG. 5O illustrates the magnetization state identification, either a vortex state or a single domain state, of the five exemplary nanomagnetic systems. FIG. 5P-FIG. 5T illustrates the salient edge segments identified by each of the fix exemplary nanomagnetic systems.

TABLE 1

Performance evaluation metrics of the magnetic coprocessor.

| FIG. | Average thickness of nanomagnetic disk (nm) | Average diameter of nanomagnetic disk (nm) | True-positive (%) | False-positive (%) |
|---|---|---|---|---|
| 4F | 10.8 | 103.5 | 83 | 39 |
| 4G | 11.3 | 112.2 | 67 | 34 |
| 4H | 11.6 | 120 | 83 | 39 |
| 4I | 11.7 | 137.4 | 86 | 35 |
| 4J | 10.7 | 145 | 83 | 31 |

The minimum edge-to-edge spacing between nanomagnets was 20 nm.

Samples in accordance with the present invention were fabricated with thicknesses between 6 nm and 19 nm. For the magnetic system with nanomagnetic disks with a thickness of 19 nm, their magnetization was observed to be only in the vortex state, and for disks with a thickness of 6 nm, it was found to be only in the single domain state.

The magnetic systems were stimulated with an external magnetic field as a clocking mechanism (driving the nanomagnets to the hard axis) then relaxed, to allow for computation to take place. The external magnetic field was applied in an out-of-plane direction with a magnitude of 0.08 T for a duration of 0.5 s. Subsequently, the magnetic system was characterized with a magnetic force microscope (MFM). The MFM images of the magnetic system are illustrated in FIG. 4F-FIG. 4J. The MFM images were analyzed to identify the magnetization states of the magnetic systems. The single domain states are marked with red dots and the vortex states with yellow dots in the magnetization state layouts shown in FIG. 4K-FIG. 4O. The single domain nanomagnets were then grouped and the corresponding edge segments were selected as the most salient. FIG. 4P-FIG. 4T shows the salient edge segments computed by the respective magnetic systems in FIG. 4F-FIG. 4J, respectively.

Table 1 presents the performance evaluation metrics of the edge images computed using the magnetic systems in FIG. 4 as well as the traditional logic-based computed edge images 125 as shown in FIG. 1. The true-positive percentages represent the number of salient edge segments that are correctly identified. The false-positive percentages represent the non-salient edge segments identified as salient edges. It is evident from Table 1 that the variation in thickness and diameter, within critical dimensions, did not affect the final outcome. This evidence supports the consistency of the magnetic system.

Of the five magnetic systems, four were able to identify more than 80% of the salient edge segments in the image. It is believed that the low true-positive percentage in the second magnetic system, FIG. 4G, is a consequence of the system reaching an energy minimum that is not close to its global energy minimum. This is due to unevenness on the surface of the nanomagnetic disks. If the nanomagnetic disks have rough surfaces or bumps, they tend to resist coupling with the neighboring nanomagnetic disks. The performance of the magnetic system can be improved by using more circular nanomagnetic disks with smoother surfaces.

Figure 6A:
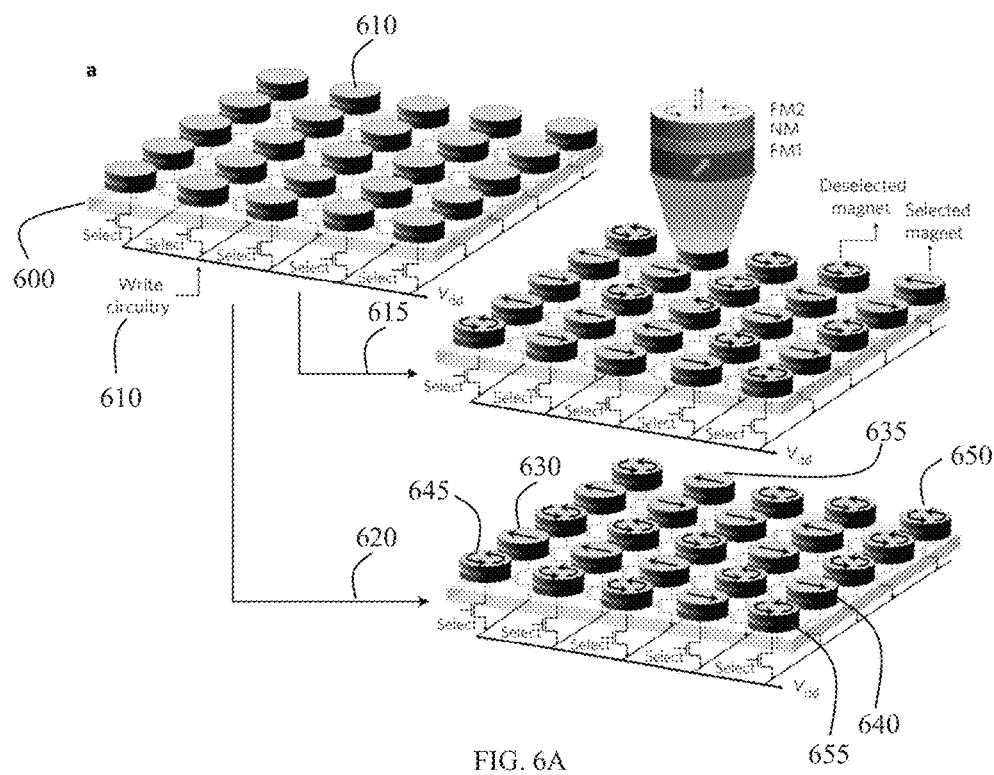
FIG. 6A is a hardware schematic of the magnetic coprocessor comprising a uniform two-dimensional STT-MRAMbased reconfigurable array with underlying circuitry, in accordance with an embodiment of the present invention.
Figure 6B:
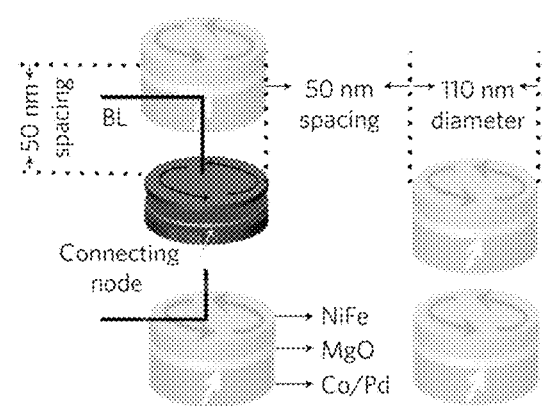
FIG. 6B is schematic of spin-torque-driven reconfigurable array of nanomagnets (STRAN), showing cell dimensions, material and spacing parameters, in accordance with an embodiment of the present invention.

In a specific embodiment, the present invention provides an N×N programmable grid of nanomagnets, which can be selected or deselected to allow for the mapping of any desired layout, thereby maximizing the potential of the magnetic coprocessor to solve many instances of a problem. While several techniques exist to manipulate the magnetization of a nanomagnets, including strain-induced and spin-transfer torque (STT), in a particular embodiment illustrated with reference to FIG. 6A, the present invention includes, a uniform two-dimensional STT magnetic random access memory (STT-MRAM) reconfigurable array. FIG. 6A illustrates a uniform two-dimensional STT-MRAM-based reconfigurable array 600 with underlying circuitry 605. In this embodiment, only selected magnets 630, 635, 640 (magnets in the single domain state) corresponding to an objective function participated in the computation after clocking. The deselected magnets 645, 650, 655 remain in a precessional state (non-computing state). Examples of two instances of the array 615, 620 are illustrated. In this particular embodiment, the array consists of magnetic tunneling junction (MJT) cells 610 with diameters of 110 nm, spaced 50 nm apart, with an out-of-place (tilted) polarized as its reference layer (FM2) and an in-plane free layer (FM1). The STT strengths have the ability to induce persistent oscillation in the free layer and can take these cells to a non-computing state. This is the mechanism used to deselect the cells from the array. The nanomagnetic disks can be deselected by passing a deselection current that takes the magnets into an oscillating state. The selected nanomagnets are then clocked (in Z direction) from their current state and then released to settle to their minimum energy state depending upon the interaction with the neighboring magnets. The coupling energy between the deselected magnets and its neighbors is very close to zero. As such, the isolated magnets settle into a vortex state and the coupled magnets settle into a single domain state. FIG. 6B illustrates the spin-toque-driven reconfigurable array of nanomagnets, showing cell dimensions, material and spacing parameters.

In the exemplary embodiment, a CMOS interface may be used for the readout of the array. CMOS sensors utilizing a differential decision and sense circuit may be used to distinguish a logic '1' from a logic '0' when reading the values of the nanomagnets. In additional embodiments, giant magnetoresistance sensors and optical sensors may be used for the readout of the array.

Figure 7:
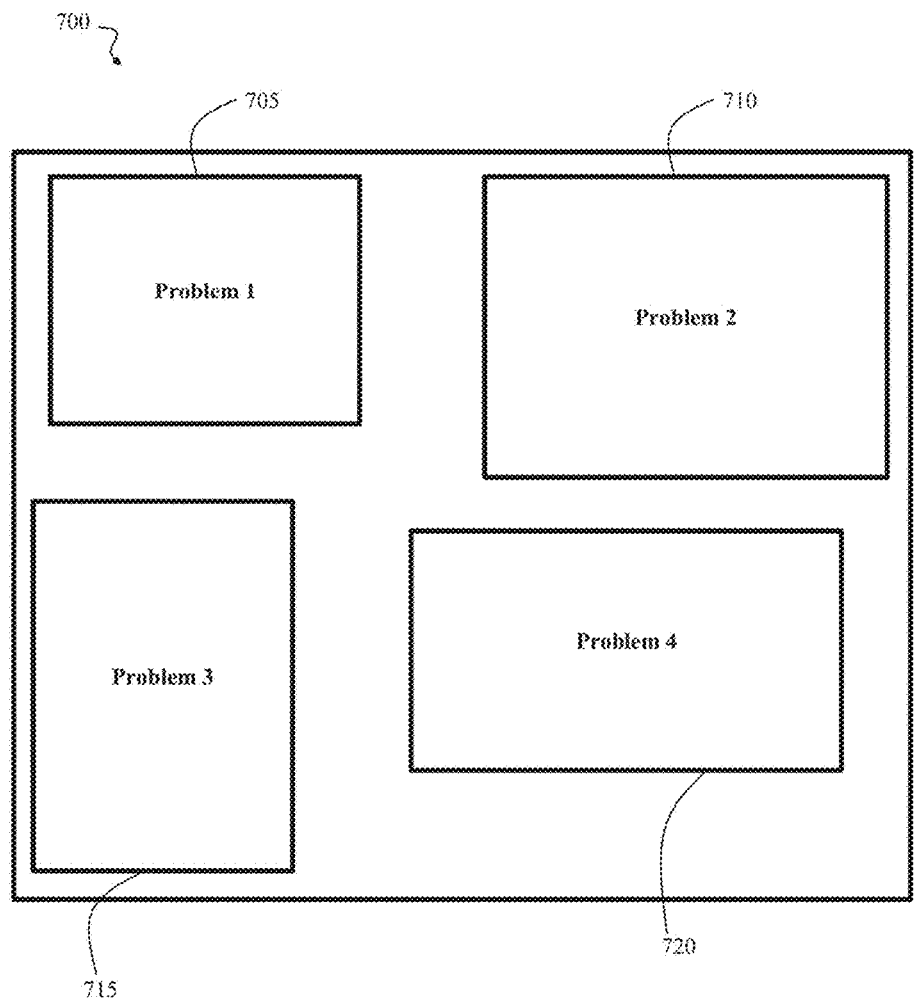
FIG. 7 is a diagram illustrating an embodiment of the present invention wherein the array of nanomagnets can be divided into one or more specific areas and each specific area may be used to solve a different quadratic minimization problem.

With reference to FIG. 7, in an additional embodiment of the present invention a two-dimensional nanomagnet array comprising a plurality of nanomagnets can be subdivided into two or more subsets of nanomagnets and therefore can be used to solve more than one quadratic optimization problem. As shown in FIG. 7, the nanomagnet array 700 may be divided into several nanomagnet subsets 705, 710, 715, 720, wherein each subset of nanomagnets can be used to solve a different quadratic optimization problem. In this embodiment, the magnetic coprocessor of the present invention can be implemented as a two-dimensional array 700 of circular MJT's with a transistor for the disk selection and read mechanism, as previously described. As was previous described, prior to driving the nanomagnets to an energized state, the nanomagnets of each nanomagnetic subset 705, 710, 715, 720 the nanomagnet array that have been mapped to the variables of the quadratic optimization problem are selected and the nanomagnets of each nanomagnetic subset 705, 710, 715, 720 of the nanomagnet array 700 that have not been mapped to the variables of the quadratic optimization problem are deselected.

In one embodiment, the nanomagnetic array 700 may be used to solve multiple quadratic optimization problems in parallel. In this embodiment, each subset of nanomagnetic may be used to simultaneously solve a different quadratic optimization problem. As such, a first subset of nanomagnets 705 may be used to solve a first quadratic optimization problem, a second subset of nanomagnets 710 may be used to solve a second quadratic optimization problem, a third subset of nanomagnets 715 may be used to solve a third quadratic optimization problem and a fourth subset of nanomagnets 720 may be used to solve a fourth quadratic optimization problem. The nanomagnet subsets can be changed depending upon the number of problems to be solved and the number of nanomagnets required for arriving at the solution.

In an additional embodiment, in order to solve multiple problems with a single nanomagnetic array 700, the magnetic coprocessor may include a selection circuit for selecting one of the nanomagnet subsets for solving a specific problem. As such, in this embodiment, a selection circuit may select a particular subset of nanomagnets 705 to be used to solve a particular quadratic optimization problem.

The present invention provides a magnetic coprocessor for directly solving routinely occurring quadratic optimization problems by harnessing the energy-minimization nature of nanomagnets. The magnetic coprocessor of the present invention can be implemented as a two-dimensional array of circular MJTs with a transistor for the disk selection and read mechanism. Accordingly, the present invention has simplified a complex vision computation problem to a single input/output clock cycle, in contrast to conventional Boolean logic circuits which require orders-of-magnitude more clock cycles.

The present invention may be embodied on various computing platforms that perform actions responsive to software-based instructions. The following provides an antecedent basis for the information technology that may be utilized to enable the invention.

A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++ or the like and conventional procedural programming languages, such as the "C" programming language or similar programming languages.

Aspects of the present invention are described below with reference to illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method for solving quadratic optimization problems, the method comprising:
   identifying a plurality of nanomagnet subsets of a nanomagnet array, wherein each of the nanomagnet subsets comprises a plurality of nanomagnets of the nanomagnet array;
   assigning one of a plurality of quadratic optimization problems to one of the plurality of nanomagnet subsets, and for each of the nanomagnet subsets having an assigned quadratic optimization problem;
   associating a plurality of variables of the assigned quadratic optimization problem with a nanomagnet of the nanomagnet subset;
   driving the nanomagnets of the nanomagnet subset to an excited state;
   allowing the nanomagnets to enter a relaxed state after being driven to an excited state, wherein the nanomagnets magnetically couple with one another in the relaxed state to minimize the total magnetic coupling energy of the nanomagnet subset; and
   sensing a magnetic coupling of the nanomagnets to solve the assigned quadratic optimization problem.

2. The method of claim 1, further comprising, prior to assigning one of a plurality of quadratic optimization problems to one of the plurality of nanomagnet subsets:
   selecting a quadratic optimization problem from the plurality of quadratic optimization problems; and
   selecting a nanomagnet subset from the plurality of nanomagnet subsets.

3. The method of claim 1, further comprising:
   assigning each of the plurality of quadratic optimization problems to one of each of the plurality of nanomagnetic subsets; and
   solving each of the plurality of quadratic optimization problems in parallel.

4. The method of claim 1, wherein associating a plurality of variables of the assigned quadratic optimization problem with a nanomagnet of the nanomagnet subset further comprises:
   identifying a plurality of variables of the assigned quadratic optimization problem;
   mapping a nanomagnet of the associated nanomagnet subset of the nanomagnetic array to each of the variables of the assigned quadratic optimization problem, wherein the distances between the nanomagnets that have been mapped to the variables of the assigned quadratic optimization problem are such that a magnetic coupling energy of the nanomagnets is proportional to an energy relationship between the plurality of variables in the assigned quadratic optimization problem.

5. The method of claim 1, further comprising, selecting the nanomagnets of each of the nanomagnet subsets of the nanomagnetic array that have been mapped to the variables of each of the assigned quadratic optimization problem and deselecting the nanomagnets of each of the nanomagnet subset of the nanomagnetic array that have not been mapped to the variables of the assigned quadratic optimization problem.

6. The method of claim 1, wherein sensing a magnetic coupling of the nanomagnets to solve the assigned quadratic optimization problem, further comprises:
   sensing a state of each of the plurality of nanomagnets of the nanomagnet subset of the nanomagnetic array to identify one or more nanomagnets of the plurality of nanomagnets that are in a single domain state; and
   mapping the single domain state nanomagnets back to the plurality of variables of the assigned quadratic optimization problem to solve the assigned quadratic optimization problem.

7. The method of claim 1, wherein the quadratic optimization problem is selected from a group of quadratic optimization problems consisting of motion segmentation, correspondence, figure-ground segmentation, clustering, grouping, subgraph matching and digital graph matching.

8. The method of claim 1, wherein sensing a magnetic coupling of the nanomagnets to solve the assigned quadratic optimization problem further comprises sensing the magnetic coupling of the nanomagnets in parallel.

9. The method of claim 1, wherein the nanomagnet array is a two-dimensional array and wherein each of the nanomagnets of the nanomagnet array is a disk-shaped magnetic tunnel junction (MTJ) nanomagnet.

10. The method of claim 1, wherein the quadratic optimization problem is a quadratic optimization problem for identifying salient edge segments of an image, and wherein associating each of a plurality of variables of a quadratic optimization problem for identifying salient edge segments of an image with a nanomagnet of a nanomagnet subset of the nanomagnetic array further comprises:
   processing an image to identify a plurality of edge segments of the image;
   calculating an affinity matrix for the plurality of edge segments of the image;
   calculating a distance map matrix for the plurality of edge segments of the image;
   generating the nanomagnet array based upon the affinity matrix and the distance map matrix; and mapping each of the edge segments of the image to one of the nanomagnets of the nanomagnet subset of the nanomagnetic array.

11. A system for solving quadratic optimization problems, the system comprising:
   a nanomagnet array comprising a plurality of nanomagnets;
   read/write/drive circuitry coupled to the nanomagnet array;
   a compiler coupled to the drive circuitry and the read/write/drive circuitry, the compiler configured for;
     identifying a plurality of nanomagnet subsets of the nanomagnet array, wherein each of the nanomagnet subsets comprises a plurality of nanomagnets of the nanomagnet array;
     assigning one of a plurality of quadratic optimization problems to one of the plurality of nanomagnet subsets, and for each of the nanomagnet subsets having an assigned quadratic optimization problem;
     associating a plurality of variables of the assigned quadratic optimization problem with a nanomagnet of the nanomagnet subset;
     instructing the read/write/drive circuitry to drive the nanomagnets of the nanomagnet subset to an excited state;
     allowing the nanomagnets to enter a relaxed state after being driven to an excited state, wherein the nanomagnets magnetically couple with one another in the relaxed state to minimize the total magnetic coupling energy of the nanomagnet subset; and
     instructing the read/write/drive circuitry to sense a magnetic coupling of the nanomagnets to solve the assigned quadratic optimization problem.

12. The system of claim 11, wherein the compiler is further configured for, prior to assigning one of a plurality of quadratic optimization problems to one of the plurality of nanomagnet subsets:
   selecting a quadratic optimization problem from the plurality of quadratic optimization problems; and
   selecting a nanomagnet subset from the plurality of nanomagnet subsets.

13. The system of claim 11, wherein the compiler is further configured for:
   assigning each of the plurality of quadratic optimization problems to one of each of the plurality of nanomagnetic subsets; and
   solving each of the plurality of quadratic optimization problems in parallel.

14. The system of claim 11, wherein associating a plurality of variables of the assigned quadratic optimization problem with a nanomagnet of the nanomagnet subset further comprises:
   identifying a plurality of variables of the assigned quadratic optimization problem;
   mapping a nanomagnet of the nanomagnet array to each of the variables of the assigned quadratic optimization problem, wherein the distances between the nanomagnets that have been mapped to the variables of the assigned quadratic optimization problem are such that a magnetic coupling energy of the nanomagnets is proportional to an energy relationship between the plurality of variables in the assigned quadratic optimization problem.

15. The system of claim 14, wherein the compiler is further configured for selecting the nanomagnets of the nanomagnet subset that have been mapped to the variables of the assigned quadratic optimization problem and deselecting the nanomagnets of the nanomagnet subset that have not been mapped to the variables of the assigned quadratic optimization problem.

16. The system of claim 11, wherein instructing the read/write/drive circuitry to sense a magnetic coupling of the nanomagnets of the nanomagnet subset to solve the assigned quadratic optimization problem, further comprises:
   instructing the read/write/drive circuitry to sense a state of each of the plurality of nanomagnets of the nanomagnet subset to identify one or more nanomagnets of the plurality of nanomagnets that are in a single domain state; and
   mapping the single domain state nanomagnets back to the plurality of variables of the assigned quadratic optimization problem to solve the assigned quadratic optimization problem.

17. The system of claim 11, wherein the nanomagnet array is a two-dimensional spin-transfer torque magnetic random access memory (STT-MRAM) reconfigurable array.

18. The system of claim 11, wherein each of the nanomagnets of the nanomagnet array is a disk-shaped magnetic tunnel junction (MTJ) nanomagnet.

19. The system of claim 11, wherein the quadratic optimization problem is selected from a group of quadratic optimization problems consisting of motion segmentation, correspondence, figure-ground segmentation, clustering, grouping, subgraph matching and digital graph matching.

20. One or more non-transitory computer-readable media having computer-executable instructions for performing a method of running a software program on a computing device for solving quadratic optimization problems, the computing device operating under an operating system, the method including issuing instructions from the software program comprising:
   communicatively accessing the operating system of the computing device;
   identifying a plurality of nanomagnet subsets of a nanomagnet array, wherein each of the nanomagnet subsets comprises a plurality of nanomagnets of the nanomagnet array;
   assigning one of a plurality of quadratic optimization problems to one of the plurality of nanomagnet subsets, and for each of the nanomagnet subsets having an assigned quadratic optimization problem;
   associating a plurality of variables of the assigned quadratic optimization problem with a nanomagnet of the nanomagnet subset;
   driving the nanomagnets of the nanomagnet subset to an excited state;
   allowing the nanomagnets to enter a relaxed state after being driven to an excited state, wherein the nanomagnets magnetically couple with one another in the relaxed state to minimize the total magnetic coupling energy of the nanomagnet subset; and
   sensing a magnetic coupling of the nanomagnets to solve the assigned quadratic optimization problem.

\* \* \* \* \*